United States Patent [19]

Ovshinsky et al.

[11] 4,178,415

[45] Dec. 11, 1979

[54] MODIFIED AMORPHOUS SEMICONDUCTORS AND METHOD OF MAKING THE SAME

[75] Inventors: Stanford R. Ovshinsky, Bloomfield Hills; Krishna Sapru, Troy, both of Mich.

[73] Assignee: Energy Conversion Devices, Inc., Troy, Mich.

[21] Appl. No.: 888,915

[22] Filed: Mar. 22, 1978

[51] Int. Cl.$^2$ .............................................. H01B 1/02
[52] U.S. Cl. ................................ 428/446; 252/500; 252/512; 204/192 S; 427/93; 427/248 C; 357/2
[58] Field of Search ................ 252/512, 500, 62.3 BT; 204/192 S; 427/93, 248 C; 357/2; 428/446

[56] References Cited

U.S. PATENT DOCUMENTS 3,917,491  11/1975  Oswald, Jr. et al. .............. 427/93 X

*Primary Examiner*—Benjamin R. Padgett
*Assistant Examiner*—E. Suzanne Parr
*Attorney, Agent, or Firm*—Wallenstein, Spangenberg, Hattis & Strampel

[57] ABSTRACT

An amorphous semiconductor film includes an amorphous semiconductor host matrix, such as silicon or silicon and oxygen, and a modifier material comprising an alkali metal, such as lithium, incorporated therein by codeposition of the same. The modifier material incorporated in the amorphous host matrix controls the electrical conductivity of the film and other phenomena associated therewith.

21 Claims, 4 Drawing Figures

MODIFIED AMORPHOUS SEMICONDUCTORS AND METHOD OF MAKING THE SAME

The principal objects of this invention are to provide an improved modified amorphous semiconductor device and the method of making the same wherein the electrical conductivity and other phenomena associated therewith are controlled by the modification thereof. The devices of this invention can have a large range of electrical conductivity vs. temperature which can make them suitable for temperature responsive control devices. They can have a high thermopower coefficient and high Seebeck coefficient which can make them suitable for thermoelectric generation and energy conversion and the like, particularly at high temperatures. They can have high temperature stability which can lead to devices for use at elevated temperatures.

Briefly, in accordance with this invention, an amorphous semiconductor film includes an amorphous semiconductor host matrix, such as silicon or silicon and oxygen, and a modifier material comprising an alkali metal, such as lithium, incorporated therein by codeposition of the same, such as by cosputtering.

In one phase of this invention, where the host matrix has a low electrical conductivity and a wide energy gap and is substantially an insulator having very few carriers available, as where it includes silicon and oxygen, the incorporation of the modifier material, such as lithium, therein provides a supply of electrons, large changes in electrical conductivity with very little change in the energy gap and the electrical activation energy, electrical band-like conduction and substantially no structural change in the host matrix. The electrons provided by the modifier material create equal numbers of positive and negative charges in the energy gap which are in the top half of the energy gap and paired states irrespective of whether even numbered or odd numbered modifier atoms are added.

In another phase of this invention, where the host matrix has a high electrical conductivity, a narrow energy gap and many carriers available for hopping-like conduction, as where it includes silicon, the incorporation of the modifier material, such as lithium, therein, in small amounts, first decreases the carriers available and the electrical conductivity and widens the energy gap and provides for electrical band-like conduction and, in large amounts, then increases the carriers available and the electrical conductivity and narrows the energy gap.

Other objects of this invention reside in the materials used in the depositions of the amorphous semiconductor films here involved and the cooperative relationships therebetween.

Further objects of this invention will become apparent to those skilled in the art upon reference to the accompanying specification, claims, and drawing, in which:

Figure 1:
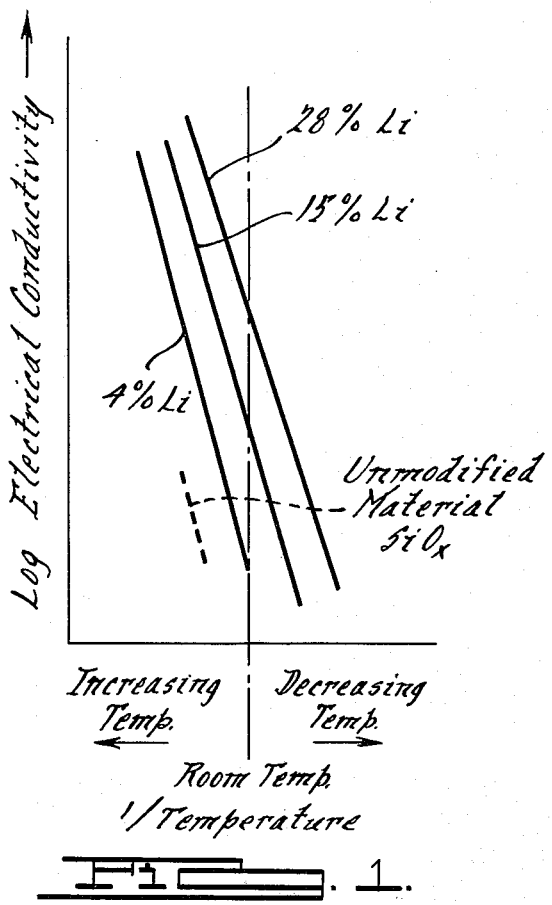
FIG. 1 is a typical and stylized graph plotting electrical conductivity versus reciprocal temperature for the silicon and oxygen amorphous host matrix and the lithium modifier therein.

The amorphous silicon film of this invention is formed by a codeposition of the amorphous host matrix and the modifier material, such as by co-vacuum deposition or cosputtering. Cosputtering can be accomplished in a conventional r.f. sputtering system, such as made and sold by R.D. Mathis, Co. Here, a cathode or target is bonded to a standard aluminum backing plate and is made of the semiconductor host matrix material to be deposited. Also, pieces of the modifier material are secured to the cathode or target. Substrates upon which the host matrix and the modifier material are to be deposited are carried by a holder located from the target by a distance of about 3.5 cm for a $3\frac{1}{2}''$ diameter cathode.

The sputtering machine is first evacuated to a vacuum pressure somewhat less than about $6 \times 10^{-6}$ torr to provide a background vacuum pressure. Argon is bled into the machine to provide an operating pressure of about $5 \times 10^{-3}$ torr as determined by a reading on a Pirani vacuum gauge, giving an actual vacuum pressure of about $7 \times 10^{-3}$ torr in the machine. The surface of the cathode or target and pieces of modifier material are first cleaned by sputtering against the shutter of the machine adjacent to substrates for about 30 minutes. Thereafter, the shutter is opened and the semiconductor material of the target and the pieces of modifier material on the target are cosputtered onto the substrates. The cathode or target and the holder for the substrates are both water cooled so that the temperatures thereof are low during the sputtering operation, as for example, approximately 50° C. The r.f. power of the machine may have a frequency of about 13.56 MegaHertz, and about 1000 Volts of forward power, about 50–70 Watts being utilized for a 3.5'' diameter cathode or target.

The deposition rates depend upon the materials being sputtered, and the time of deposition is varied to obtain desired thicknesses of the deposit. The thicknesses of the simultaneously deposited amorphous semiconductor film having the modifier therein may vary from a few 100 Å to about 5μ, depending upon the uses to which the amorphous semiconductor film is to be put. The amorphous semiconductor material is deposited on the substrates in amorphous form.

The amount of modifier material homogeneously incorporated in the amorphous host matrix in forming the amorphous semiconductor film is generally determined by the area of the pieces of the modifier material applied to the semiconductor material of the cathode or target. Desired percents of modifier material added to the amorphous semiconductor material may accordingly be conveniently controlled. By utilizing cosputtering as generally here described, the modifier material is substantially homogeneously incorporated in the semiconductor material to provide the beneficial features of this invention.

Two phases of this invention are set forth herein for purposes of illustration, one where the amorphous semiconductor host matrix includes silicon and oxygen and which is modified by lithium, and the other includes sputtered silicon as the amorphous semiconductor host matrix which is modified by lithium.

With respect to the first phase of this invention, the ratio of the silicon to oxygen in the amorphous semiconductor host matrix may be expressed as $SiO_x$, where x can vary from above 0 to 2, and this can be determined by having an appropriate ratio in the cathode or target being sputtered. By utilizing a cathode or target of $SiO_2$ and sputtering the same without the addition of oxygen in the sputtering atmosphere, x in the above ratio is about 1.6, so that the ratio of silicon to oxygen is about 1:1.6, which is exemplarly used herein. Other ratios, more or less, can be utilized in accordance with this phase of this invention with generally the same results being obtained. If a larger ratio is desired in the host matrix, oxygen may be supplied to the sputtering atmosphere and if a lower ratio is desired, a cathode having less oxygen therein can be utilized. The energy gap in the host matrix is generally controlled by this ratio, basically the more oxygen, the wider the energy gap.

Figure 2:
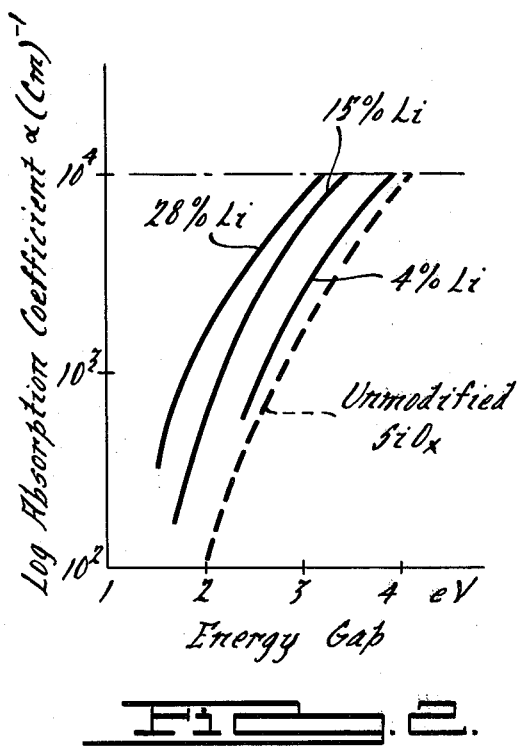
FIG. 2 is a typical and stylized graph plotting absorption coefficient versus energy gap for the silicon and oxygen amorphous host matrix and the lithium modifier therein.
Figure 3:
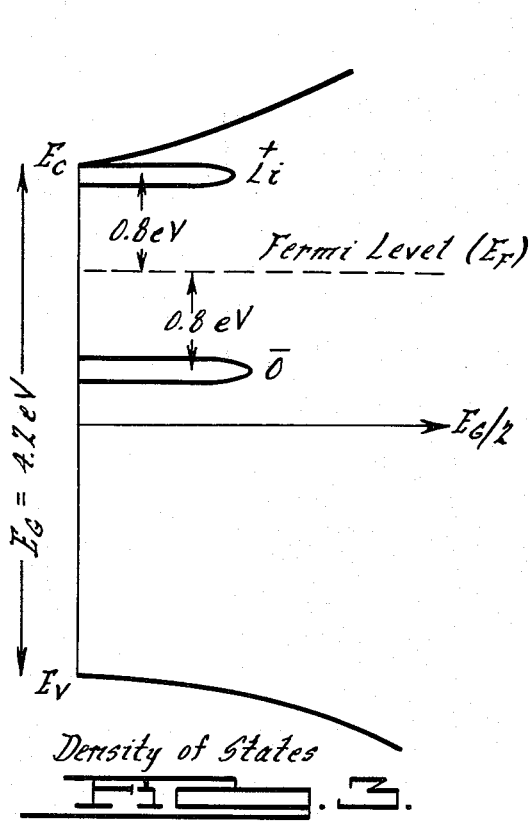
FIG. 3 is a typical and stylized graph plotting density of states against energy gap for the silicon and oxygen amorphous host matrix with the modifier material incorporated therein.

Various amounts of lithium are incorporated in the $SiO_x$ including, for example, 4% Li, 15% Li, and 28% Li. These modifications of the $SiO_x$ host matrix are illustrated in FIGS. 1 to 3 and set forth in the following tabulation.

|  | $\sigma_{RT}(\Omega cm)^{-1}$ | $\Delta E$ (eV) | $E_G$ (eV) |
|---|---|---|---|
| $SiO_x$ | $\approx 10^{-15}$ | 0.79 | 4.2 |
| $SiO_x$ + 4% Li | $2 \times 10^{-12}$ | 0.79 | 4.1 |
| $SiO_x$ + 15% Li | $5 \times 10^{-9}$ | 0.51 | 3.5 |
| $SiO_x$ + 28% Li | $8 \times 10^{-7}$ | 0.46 | 3.26 |

From these figures and the tabulation it is seen that the unmodified $SiO_x$ host matrix has a room temperature electrical conductivity, $\sigma_{RT}(\Omega cm)^{-1}$, of about $10^{-15}$ and electrical activation energy, $\Delta E$ (eV), of about 0.79, and an energy gap (eV) of about 4.2. As increasing amounts of the lithium modifier are incorporated in the host matrix, it is seen that there is a drastic increase in room temperature electrical conductivity as set forth in the tabulation and in FIG. 1. It is also seen that there is only a small decrease in electrical activation energy and only a small decrease in the energy gap. The small decrease in energy gap is illustrated in FIG. 2 which is determined by the photon energy corresponding to an absorption coefficient $\alpha(cm)^{-1}$ of $10^4$. The electrical conductivity is by bandlike conduction with a constant activation energy over 9 orders of magnitude as indicated by the straight line nature of the curves of FIG. 1. In addition, the modified host matrix of this phase of the invention has a high thermopower of Seebeck coefficient of at least 1500 microvolts per degree C at temperatures of 125° C.

When lithium is added to the $SiO_x$ host matrix, an exothermic reaction

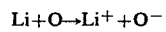

takes place. During the cosputtering process the lithium atoms become ionized, forming $Li^+$ ions and electrons according to

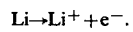

These electrons are taken up by the highly electronegative oxygen atoms according to

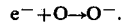

The ions $O^-$ then form nonbridging oxygens in the $SiO_x$ host matrix. The exothermic nature of this reaction results in a negative effective correlation energy, which tends to pin the Fermi level. The nonbridging oxygens are the primary source of the conducting electrons and a nonbridging oxygen is created by substantially every lithium atom introduced into the $SiO_x$ host matrix.

The electronic structure of Li-modified $SiO_x$ is illustrated in FIG. 3 and it comprises a compensated semiconductor with ionized lithium donor levels just below the conduction band edge, $E_c$, and nonbridging oxygen levels about 1.6 eV further below. The Fermi level is 0.8 eV above the latter. The two levels and the Fermi level are all in the top half of the energy gap. The amounts of lithium ions and nonbridging oxygens in these respective levels depend upon the amount of lithium modifier incorporated in the $SiO_x$ host matrix.

With respect to the other phase of this invention wherein the amorphous semiconductor host matrix comprises amorphous silicon which is modified by lithium, the amorphous semiconductor film can be deposited by sputtering in the manner described above. Here, however, the cathode or target is formed of pure silicon and pieces of the modifier material, such as lithium, are secured to such cathode or target. The silicon and the lithium are cosputtered to form the host matrix with the modifier material incorporated therein.

The conductivity of amorphous silicon films is greatly influenced by the presence of various defect states, most notably dangling bonds. By incorporating small amounts of lithium in the host matrix by cosputtering, compensation of defects can be obtained, and by incorporating larger amounts of lithium, modification of the host matrix can be obtained. This is set forth in FIG. 4 and in the following tabulation.

|  | $\sigma_{RT}(\Omega cm)^{-1}$ | $\Delta E$ (eV) | $E_G$ (eV) |
|---|---|---|---|
| Sputtered Si | $1.3 \times 10^{-4}$ | 0.15 | 1.3 |
| Sputtered Si + Li ($\sim$ 5%) | $5 \times 10^{-9}$ | 0.52 | 1.9 |
| Sputtered Si + Li ($\sim$ 10%) | $10^{-7}$ | 0.33 | 4 |

Figure 4:
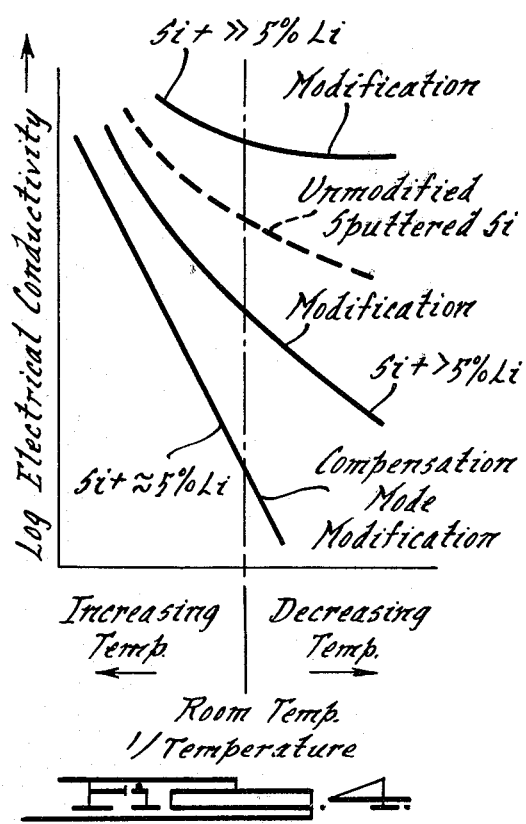
FIG. 4 is a typical and stylized graph plotting electrical conductivity versus inverse temperature for a silicon amorphous host matrix with lithium modifiers incorporated therein.

Amorphous silicon films prepared by sputtering, and which are unmodified, have a relatively high room temperature electrical conductivity, $\sigma_{RT}(\Omega cm)^{-1}$, a relatively low activation energy, $\Delta_E(eV)$, and a relatively narrow energy gap, $E_G(eV)$, as shown in the tabulation. The electrical conductivity of the unmodified amorphous silicon film is shown in dotted lines in FIG. 4. Incorporation of the lithium modifier in the amorphous matrix first operates to decrease the electrical conductivity, increase the electrical activation energy, and increase the energy gap until about 5% of lithium modifier is incorporated, as shown in the tabulation and as shown in FIG. 4 by the curve marked compensation mode modification. In this respect, the lithium modifier, therefore, operates to decrease the density of states in the energy gap.

When larger amounts of lithium are incorporated in the host matrix, over and above the aforementioned 5% lithium inclusion, the room temperature electrical conductivity increases, the electrical activation energy decreases and the energy gap decreases, as shown in the tabulation and in FIG. 4 where the lithium inclusion is, for example, 10%. When the lithium content is increased still further, more modification takes place so as to provide a still higher room temperature electrical conductivity, still lower electrical activation energy and still narrower energy gap. In unmodified amorphous silicon, there is no photoconductive effect. But where the amorphous silicon film is compensated with the aforementioned 5% amount of lithium, a substantial photoconductive effect is noted. However, upon further increase in the amounts of silicon added to the film, the photoconductive effect decreases.

There are a number of states in the gap which are introduced during the preparation by sputtering of the amorphous silicon films. These states are responsible for some component of the conductivity thereof. The electrical conductivity in such films is by hopping. Adding small amounts of lithium to the films compensates these states, as is evidenced by the decrease in electrical conductivity and an increase in the electrical activation energy and the width of the energy gap. With the addition of small amounts of lithium to the amorphous silicon, the electrical conduction becomes more bandlike conduction, as is evidenced by the substantially straight line character of such modified semiconductor as illustrated in FIG. 4.

When large amounts of lithium are added, the lithium acts as donors creating new states in the gap which operate to increase the room temperature electrical conductivity, and to decrease the electrical activation energy and the width of the energy gap. Small amounts of added lithium are less than about 5% and large amounts are greater than about 5%, a fully compensated host matrix containing about 5% lithium.

While specific reference has been made to lithium as a modifier element for the amorphous semiconductor host matrices, other alkali metals, such as sodium, could be used therefor.

While for purposes of illustration several forms and phases of this invention have been disclosed, other forms thereof may become apparent to those skilled in the art and, therefore, this invention is to be limited only by the appended claims.

We claim:

1. The method of making an amorphous semiconductor device comprising depositing on a substrate an amorphous semiconductor film including an amorphous semiconductor host matrix comprising silicon and oxygen and a modifier material comprising an alkali metal incorporated therein by codeposition of the same, and controlling the amounts of silicon and oxygen in the amorphous host matrix, wherein the silicon to oxygen ratio is represented by $SiO_x$ where x can be controlled from above 0 to 2, and the amount of alkali metal incorporated therein for controlling the energy gap and the room temperature electrical conductivity of the device.

2. The method of claim 1 wherein the codeposition is by cosputtering.

3. The method of claim 1 wherein the alkali metal comprises lithium.

4. The method of claim 3 wherein the percent range of lithium incorporated in the amorphous semiconductor host matrix can be up to more than 28%.

5. The method of claim 1 wherein a large change in room temperature electrical conductivity can be obtained with very little change in the energy gap and the electrical activation energy.

6. The method of claim 1 wherein the electrical conductivity is by bandlike conduction.

7. An amorphous semiconductor device comprising an amorphous semiconductor film deposited on a substrate and including an amorphous semiconductor host matrix comprising silicon and oxygen and a modifier material comprising an alkali metal incorporated therein which provides a supply of electrons and having an energy gap and an increased room temperature electrical conductivity, wherein the silicon to oxygen ratio is represented by $SiO_x$ where x can be controlled from above 0 to 2.

8. The device of claim 7 wherein the alkali metal comprises lithium.

9. The device of claim 8 wherein the percent range of lithium incorporated in the amorphous semiconductor host matrix can be up to more than 28%.

10. The device of claim 7 wherein the amount of incorporated alkali metal drastically affects the room temperature electrical conductivity with very little effect on the energy gap and the electrical activation energy.

11. The device of claim 7 wherein the electrical conduction is by bandlike conduction.

12. The device of claim 7 wherein the electrons provided by the modifier material do not change the structural matrix of the host material.

13. The device of claim 7 wherein the electrons provided by the modifier material create equal numbers of positive and negative charges in the energy gap.

14. The device of claim 13 wherein the positive and negative charges are in the top half of the energy gap.

15. The device of claim 7 wherein it has a constant electrical activation energy over 9 orders of magnitude.

16. The device of claim 7 wherein it has a high thermopower of at least 1500 microvolts per degree C at temperatures of 125° C.

17. The device of claim 7 wherein the large energy gap and substantially dielectric material of the host matrix which has very few carriers available is transformed into a large band gap semiconductor material which can accept a continuous increase of free carriers whose supply is proportionate to the amount of modifier material incorporated therein.

18. The device of claim 7 wherein the amorphous semiconductor film comprises a material in which paired states are automatically created irrespective of whether even numbered or odd numbered modifier atoms are added.

19. The method of making an amorphous semiconductor device comprising depositing on a substrate an amorphous semiconductor film including an amorphous semiconductor host matrix comprising silicon and a modifier material incorporated therein comprising lithium by codepositing the same, and controlling the amount of lithium incorporated in the amorphous host matrix, wherein small amounts of lithium decrease the room temperature electrical conductivity, increase the electrical activation energy and energy gap, and increase the photoconductivity of the device, and large amounts of lithium increase the room temperature electrical conductivity, decrease the electrical activation energy and the energy gap, and decrease the photoconductivity of the device.

20. The method of claim 19 wherein the codeposition is by cosputtering.

21. The method of claim 19 wherein said small amounts of lithium are less than approximately 5% and said large amounts of lithium are more than approximately 5%.

* * * * *